(12) United States Patent
Takayanagi

(10) Patent No.: US 6,949,425 B2
(45) Date of Patent: Sep. 27, 2005

(54) SEMICONDUCTOR DEVICE INCLUDES GATE INSULATING FILM HAVING A HIGH DIELECTRIC CONSTANT

(75) Inventor: Mariko Takayanagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 71 days.

(21) Appl. No.: 10/680,163

(22) Filed: Oct. 8, 2003

(65) Prior Publication Data

US 2004/0070037 A1 Apr. 15, 2004

Related U.S. Application Data

(62) Division of application No. 10/106,345, filed on Mar. 27, 2002, now Pat. No. 6,664,577.

(30) Foreign Application Priority Data

Mar. 28, 2001 (JP) .................................. 2001-092531
Mar. 25, 2002 (JP) .................................. 2002-083380

(51) Int. Cl.[7] .................... H01L 21/8238; H01L 21/336
(52) U.S. Cl. ...................................... 438/216; 438/287
(58) Field of Search .................................. 438/216, 287

(56) References Cited

U.S. PATENT DOCUMENTS 6,013,553 A    1/2000  Wallace et al.
6,303,481 B2   10/2001 Park
6,576,967 B1 * 6/2003  Schaeffer et al. ............ 257/411
6,841,439 B1 * 1/2005  Anthony et al. ............. 438/216
2002/0047141 A1 4/2002 Teramoto

FOREIGN PATENT DOCUMENTS

| JP | 11-135774 | 5/1999 |
| JP | 2000-3885 | 1/2000 |
| JP | 2002-203958 | 7/2002 |
| JP | 2003-234471 | 8/2003 |
| WO | WO 00/49643 | 8/2000 |

OTHER PUBLICATIONS

Yudong Kim, et al. "Conventional n-channel MOSFET devices using single layer $HfO_2$ and $ZrO_2$ as high-k gate dielectrics with polysilicon gate electrode", IEDM, 01–455, pp. 455–458.

* cited by examiner

Primary Examiner—David A. Zarneke
(74) Attorney, Agent, or Firm—Oblon, Spivak, McClelland, Maier & Neustadt, P.C.

(57) ABSTRACT

A semiconductor device comprising a semiconductor substrate and a MOSFET provided on the semiconductor substrate, the MOSFET including a gate insulating film and a gate electrode provided on the gate insulating film, wherein the gate insulating film has a higher dielectric constant in a side contacting the semiconductor substrate than in a side contacting the gate electrode.

5 Claims, 4 Drawing Sheets

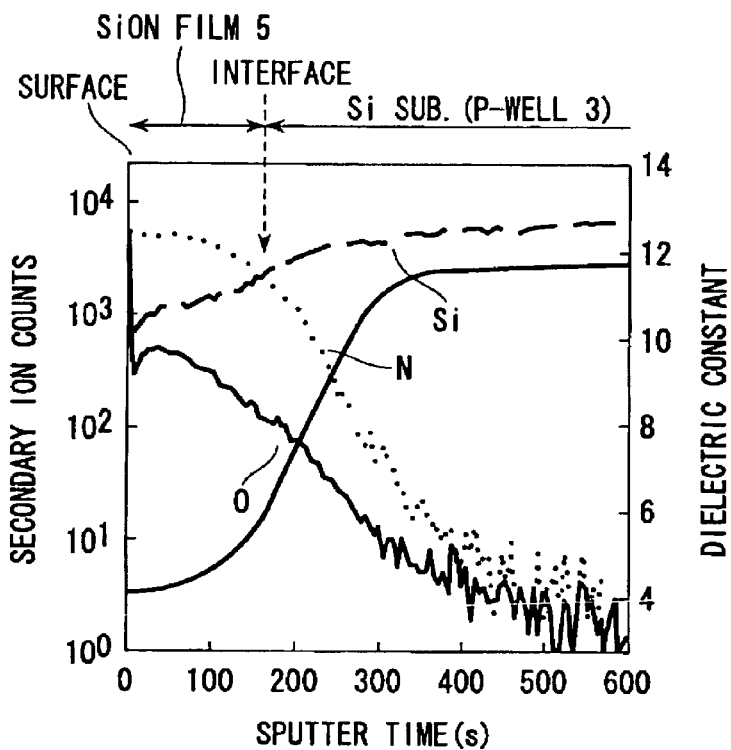
FIG. 3
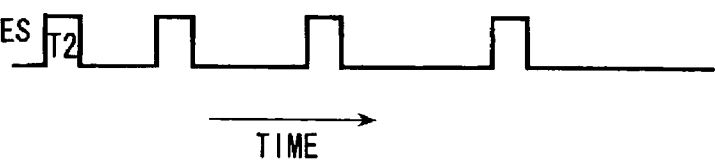

_US 6,949,425 B2_

SEMICONDUCTOR DEVICE INCLUDES GATE INSULATING FILM HAVING A HIGH DIELECTRIC CONSTANT

CROSS REFERENCE TO RELATED APPLICATIONS

This application is based upon and claims the benefit of priority from the prior Japanese Patent Applications No. 3001-092531, filed Mar. 28, 2001; and No. 2002-083380, filed Mar. 25, 2002, and from U.S. application Ser. No. 10/106,345, filed Mar. 27, 2002 now U.S. Pat. No. 6,664,577, the entire contents of which are incorporated herein by reference.

BACKGROUND OF THE INVENTION

1. Field of the Invention

The present invention relates to a semiconductor device, and more particularly, to a semiconductor device, such as a MOSFET, which has a gate insulating film exhibiting a specific dielectric constant distribution, and a method of manufacturing the same.

2. Description of the Related Art

MOSFETs formed on a semiconductor substrate are getting smaller. The gate insulating film of a MOSFET has become proportionally thinner. The roadmap of ITRS (International Technology for Roadmap Semiconductors), U.S.A., predicts that the oxide films for gate insulating films will have a thickness of 1.2 nm or less in the middle of 2002.

A gate leakage current, which results from a direct tunneling current, flows in such thin oxide films in great quantities. This leads to an increase in power consumption in MOSFETs having such an oxide film. In some cases, this may decreases the operating efficiency of MOSFETs. The direct tunneling current depends on the thickness of the gate insulating film. The thickness of the gate insulating film can be decreased, but to a limited value.

To solve the problems that small MOSFETs have due to the direct tunneling current, it is proposed that the gate insulating film of each small MOSFET should have a higher dielectric constant than that of silicon oxide film, i.e., the conventional gate insulating film. More specifically, it is proposed that the gate insulating film be made of, for example, $Si_xN_y$, $Ta_xO_y$, $Ti_xO_y$, $Hf_xO_y$, $Zr_xO_y$, or the like. The gate insulating film can then have a sufficient effective thickness, i.e., physical thickness, without having its electrically equivalent thickness to $SiO_2$ increased. If a gate insulating film having so high dielectric constant is used, however, the thermal stability and resistance to oxidation of the film must be taken into consideration in the process of manufacturing the small MOSFET.

Generally, films having high dielectric constant are inferior to the conventional silicon oxide film, in terms of thermal stability and resistance to oxidation. Therefore, it is well anticipated that if such a film having a high dielectric constant is used as a gate insulating film, the edge of the gate electrode (made of, for example, polysilicon) cannot be easily rounded by post oxidation in order to suppress the electric field concentration at the gate edge of the MOSFET.

In the future the gate electrode of the small MOSFET will probably be made of metal, not polysilicon. The edge of a gate electrode made of metal will hardly be rounded by means of post oxidation.

In the conventional semiconductor device, the gate edge cannot be rounded due to the limited thermal stability and resistance to oxidation of the gate insulating film if the gate insulating film of the small MOSFET is a film having a high dielectric constant as described above. The gate insulating film may have but low reliability due to, for example, a small breakdown voltage, which results from the electric field concentration at the gate edge.

BRIEF SUMMARY OF THE INVENTION

According to an aspect of the invention, there is provided a semiconductor device comprising a semiconductor substrate and a MOSFET provided on the semiconductor substrate, wherein the MOSFET includes a gate insulating film and a gate electrode provided on the gate insulating film, and the gate insulating film has a higher dielectric constant in the side of the surface contacting with the semiconductor substrate than in the side of the surface contacting with the gate electrode.

BRIEF DESCRIPTION OF THE SEVERAL VIEWS OF THE DRAWING

FIG. 3 is a graph representing a specific dielectric constant distribution observed around the interface between a gate insulating film and a semiconductor substrate shown in FIG. 2;

FIGS. 4A to 4C are timing charts explaining a method controlling flow rates of gases to impart the specific dielectric constant distribution to the gate insulating film;

DETAILED DESCRIPTION OF THE INVENTION

Various embodiments of the present invention will be described in detail, with reference to the accompanying drawings.

<First Embodiment in which a Specific Dielectric Constant Distribution is Denoted in the Thickness Direction of the Gate Insulating Film>

Figure 1:
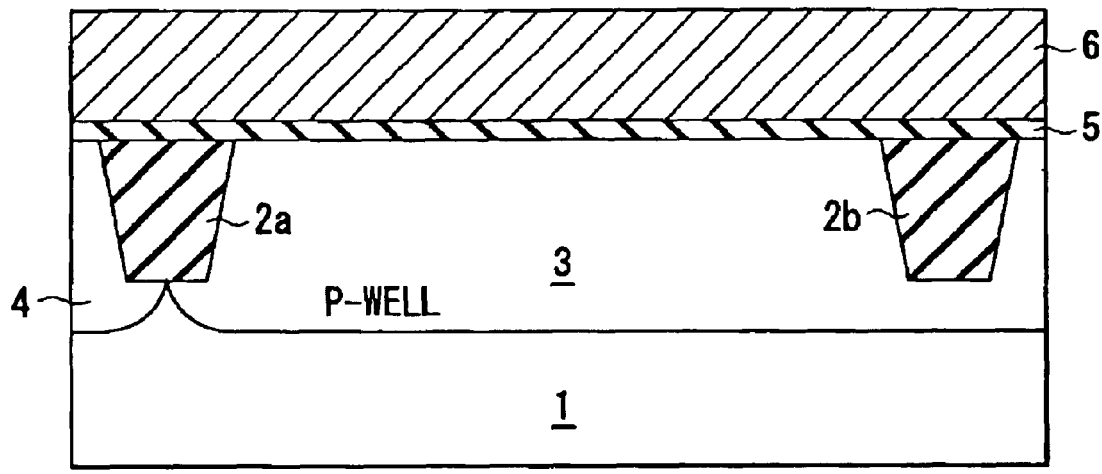
FIG. 1 is a sectional view explaining an intermediate step of manufacturing a semiconductor device according a first embodiment of the invention.
Figure 2:
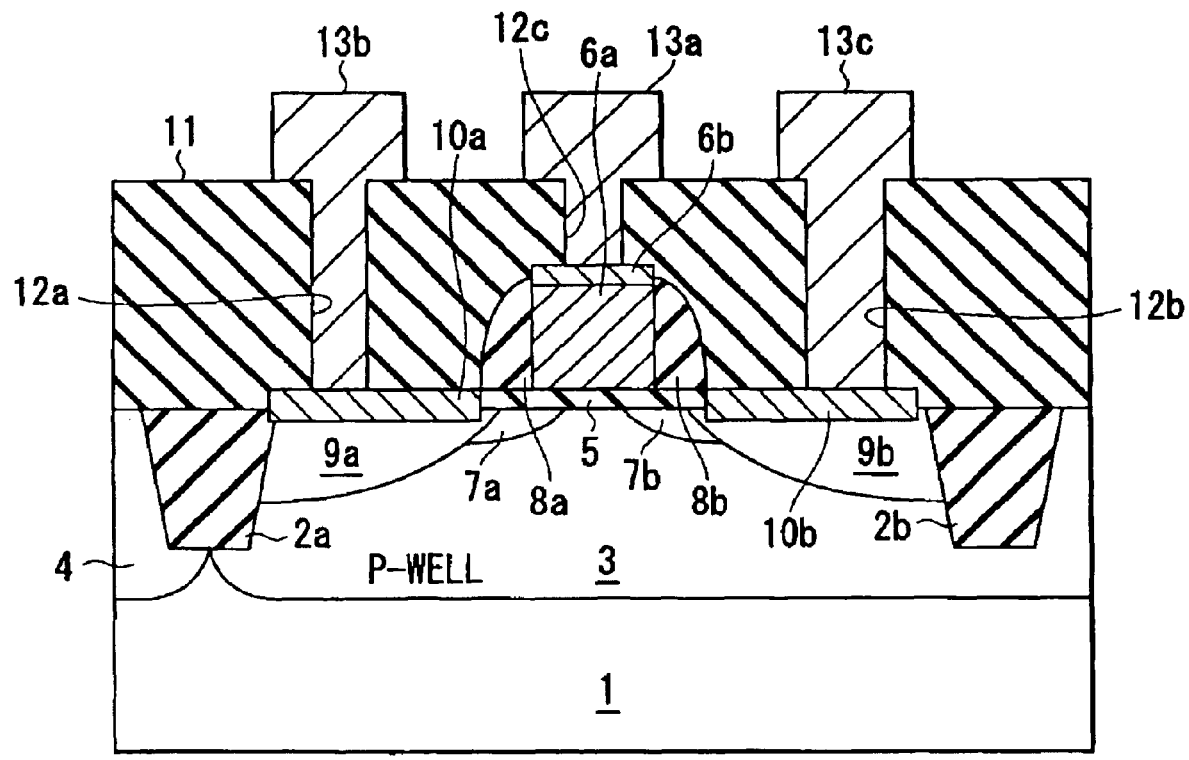
FIG. 2 is a sectional view explaining a step of manufacturing the device, which follows the step shown in FIG. 1.

FIGS. 1 and 2 show a major structure of a semiconductor device manufactured in steps of a method of manufacturing the semiconductor device according to the first embodiment of the present invention.

First, the intermediate structure of the semiconductor device shown in FIG. 1 is formed in the following manner. As FIG. 1 shows, element isolation regions 2a and 2b are formed in one surface of a semiconductor substrate 1 (for example, a silicon substrate). The element isolation regions 2a and 2b have an STI (Shallow Trench Isolation) structure. Instead, element isolation regions of LOCOS (field oxide-film isolation) structure may be formed in similar manner.

Then, P-type impurities, such as boron (B), are introduced into an NMOSFET-forming region of the silicon substrate 1, thereby forming a P-type region 3 (so-called "P well") that will be an element region of the NMOSFET. Further, N-type impurities, such as arsenic (As), are introduced into a PMOSFET-forming region of the silicon substrate 1, thereby forming an N-type region 4 (so-called "N well") that will be an element region of the PMOSFET. A gate insulating film 5 is formed on the substrate 1, covering the wells 3 and 4. A polysilicon film 6 is deposited on the gate insulating film 5, to a thickness of, for example, 200 nm.

In this embodiment, a prescribed dielectric constant distribution is imparted to the gate insulting film 5 while the film 5 is being formed. The gate insulating film 5 therefore has a higher dielectric constant in the side contacting the semiconductor substrate 1 than in the side contacting the gate electrode 6a, as will be explained later.

After the polysilicon film 6 is deposited, photolithography and etching processes are performed, both being of ordinary types. The film 6 is thereby removed, except the part that lies between the element isolation regions 2a and 2b formed in the P well 3, as is illustrated in FIG. 2. This part of the film 6 functions as the gate electrode 6a of the NMOSFET.

Thereafter, N-type impurity ions (e.g., As ions) are implanted at a low acceleration voltage into the P well 3 for forming the NMOSFET, by using the gate electrode 6a, for example, as a mask. Similarly, P-type impurity ions (e.g., B ions) are implanted at a low acceleration voltage into the N well 4 for forming the PMOSFET. As a result, on the sides of the gate electrode 6a, a shallow N-type source and drain regions 7 are formed in the P well 3 for the NMOSFET region. The similar shallow source and drain regions (not shown) are formed in the P well 4.

Then, a silicon nitride film is deposited on the entire surface of the substrate 1. RIE (Reactive Ion Etching) is carried out, forming silicon nitride sidewalls 8a and 8b on the sides of the gate electrode 6a.

Then, after an ordinary photolithography method is performed, N-type impurity ions (e.g., As ions) are implanted into a selected part of the P well 3 (i.e., NMOSFET-forming region) at a low acceleration voltage, by using the silicon nitride sidewalls 8a and 8b as a mask. Source and drain diffusion layers 9a and 9b are thereby formed in the NMOSFET-forming region 3. In the similar manner, using the side-walls on the sides of the gate electrode (not shown) formed on the P well 4 provided in the PMOSFET-forming region, P-type impurity ions (e.g., B ions) are implanted at a low acceleration voltage into the regions on both sides of the gate electrode, forming source and drain diffusion layers for the PMOSFET.

Ti silicide films 10a and 10b are formed on the source diffusion layer 9a and the drain diffusion layer 9b, both provided in the N well 3 for forming the NMOSFET and a Ti silicide film 6b is formed on the gate electrode 6a, all by the method well known in the art.

Then, LPCVD (Low-Pressure Chemical Vapor Deposition) is carried out, depositing an LPCVD oxide film made of $SiO_2$ to a thickness of about 900 nm on the entire surface of the structure. The LPCVD oxide film is subjected to CMP (Chemical Mechanical Polishing) or the like and thereby made flat at the upper surface. Thus processed, the LPCVD oxide film acting as an inter-layer insulating film 11 is formed.

Contact holes 12a and 12b are made in the inter-layer insulating film 11, exposing the prescribed surface portions of the Ti silicide films 10a and 10b that are provided on the source and drain diffusion layers 9a and 9b, respectively. A contact hole 12c is made in the inter-layer insulating film 11, too, reaching at a part of the Ti silicide film 6b provided on the gate electrode 6a. A metal-alloy wiring layer (e.g., Al—Si—Cu) is deposited to a thickness of about 400 nm, on the entire surface of the resultant structure. Ordinary photolithography and ordinary etching are performed on the metal-alloy wiring layer to form wiring layers 13a, 13b and 13c.

In the embodiment shown in FIG. 2, a prescribed dielectric constant distribution is imparted to the gate insulating film 5 while the film 5 is being formed. That is, the film 5 is processed to have a higher dielectric constant in the side contacting the P well 3 formed in the substrate 1 than in the side contacting the gate electrode 6a. The prescribed dielectric constant distribution can be imparted to the gate insulating film 5 in various methods, which will be described below.

(a) In a Case where the Gate Insulating Film 5 is Made of SiON Film.

To form the gate insulating film 5 in the structure of FIG. 1, silane gas and ammonia gas are applied to the substrate 1 held in a reaction furnace. A SiN film is thereby formed on the entire surface of the substrate 1, to a physical thickness of about 1.4 nm. Oxygen is then introduced into the SiN film by means of plasma oxidation to form the SiON film 5.

The plasma oxidation introduces oxygen into the SiON film 5, resulting in a specific oxygen distribution in the SiON film 5. As seen from the solid line in FIG. 3, which shows the results of SIMS analysis, the SiON film 5 has a high oxygen (O) distribution in the upper surface and a low oxygen distribution in the interface with the Si substrate 1 (i.e., the interface with the P well 3 or N well 4). The higher the oxygen contents of the SiON film 5, the lower the dielectric constant of the SiN film 5 as shown in FIG. 3. Hence, the dielectric constant is higher at the interface with the Si substrate 1 than in the upper surface of the film 5. In the process of forming the SiON film 5, silane gas may be replaced by a silane-based gas such as dichlorosilane.

(b) In a Case where a Film 5 is Made of Hf Silicate Formed by MOCVD.

A Hf silicate $((HfO_2)_x((SiO_2)_{1-x}, x \leq 1)$ film is formed by MOCVD, as gate insulating film 5, on the Si substrate (FIG. 1) held in a reaction furnace (not shown). The ratio of the flow rates of a Hf-based feed gas (e.g., $C_{16}H_{40}N_4Hf$), a Si-based feed gas (e.g., $C_8H_{24}N_4Si$) and $O_2$ is adjusted so that the flow rate of oxygen may increase with time. The gate insulating film 5 thus formed can therefore contain much $HfO_2$ in the side contacting the Si substrate 1 and more $SiO_2$ than $HfO_2$ in the upper surface of the film 5. The greater the $HfO_2$ content, the higher the dielectric constant. Hence, the gate insulating film 5 has a high dielectric constant at the interface with the P well 3 and a low dielectric constant in the side contacting the gate electrode 6a. The feed gases may be replaced other similar gases.

In the gate insulating film 5, the $HfO_2$ concentration can be higher than the $SiO_2$ concentration in the side contacting the Si substrate 1 and the $SiO_2$ concentration can be higher than the HfO$_2$ concentration in the upper surface contacting the gate electrode 6a if the temperature at which the film 5 is formed is decreased from 650° C. to 400° C. Therefore, when the film-forming temperature is so changed, instead of adjusting the ratio of the flow rates of the Hf-based feed gas, Si-based feed gas and O$_2$, a desired dielectric constant distribution may also be realized.

(c) In a Case where the Film 5 is Made of Hf Silicate and Formed by ADL.

An Hf silicate film is formed on the Si substrate 1 (FIG. 1) by ALD method, by supplying Hf-based feed gas, Si-based feed gas and oxygen (O$_2$) into the reaction furnace, intermittently at such timings as shown in FIGS. 4A to 4C. More precisely, O2 is supplied for a longer period each time in a manner: (t1<t2<t3<t4) as is shown in FIG. 4A, whereas the Hf-based feed gas and the Si-based feed gas are supplied for the same period each time as is illustrated in FIGS. 4B and 4C. As a result, the HfO$_2$ content is higher than the SiO$_2$ content in the side of the gate insulating film 5 which contacts the Si substrate 1, and the SiO$_2$ content is higher than the HfO$_2$ content in the upper surface of the film 5 contacting the gate electrode 6a. Thus, the gate insulating film 5 can have a high dielectric constant in the side contacting the Si substrate 1 and a low dielectric constant in the upper surface.

Thus, in the first embodiment, While the film 5 is being formed, its dielectric constant is varied in the direction of thickness (depth) of the film 5. The following relation is therefore satisfied:

$$\in \text{diele(sub)} > \in \text{diele(elec)}$$

where ∈ diele (sub) is the dielectric constant of the film 5 in the side contacting the substrate 1, and ∈ diele (elec) is the dielectric constant in the film 5 in the side contacting the gate electrode 6a.

Thus, the gate insulating film 5 has a higher dielectric constant than SiO$_2$ in the side contacting the substrate 1 when the gate voltage is applied between the gate electrode 6a and the source/drain regions 7a and 7b. Since the film 5 has a greater physical thickness than the conventional silicon oxide films, it can suppress the gate leakage current resulting from the direct tunneling current, though it has the same thickness as the conventional silicon oxide films.

Further, the lines of electric force, emanating from the gate electrode 6a hardly pass through the edges of the gate insulating film 5. This is because the film 5 has a small dielectric constant in the side that contacts the gate electrode 5a. The lines of electric force therefore tend to concentrate at the center part of the gate insulating film 5. The lines of electric force exist in a high density at the center part of the film 5 and in a low density at the edges of the film 5. Thus, no electric field concentration may occur at the edges of the gate electrode 6a.

Further, in the embodiment of FIG. 2, the shallow source diffusion layer 7a and the shallow drain diffusion layer 7b have their distal ends located more inside the channel than the edges of the gate electrode 6a. The lines of electric force therefore may concentrate at the distal ends of the diffusion layers 7a and 7b. This mitigates the electric field concentration at the gate edge.

While the film 5 is being formed, its dielectric constant may be varied along the channel length direction in the MOSFET as will be described below. In this case, the following relation is satisfied:

$$\in \text{diele(center)} > \in \text{diele(edge)}$$

where ∈ diele(center) is the dielectric constant the film 5 has at the center part of the channel, and ∈ diele (edge) is the dielectric constant the film 5 has at the edges of the channel near the source/drain regions.

<Second Embodiment wherein Dielectric Constant Varies Along the Channel in the Channel Length Direction>

This embodiment is identical to the first embodiment in terms of the basic structure of the MOSFET. It differs only in the distribution of dielectric constant in the gate insulating film. For simplicity, the components identical to those of the first embodiment are designated at the same reference numerals and will not be described in detail in the following description.

Figure 5:
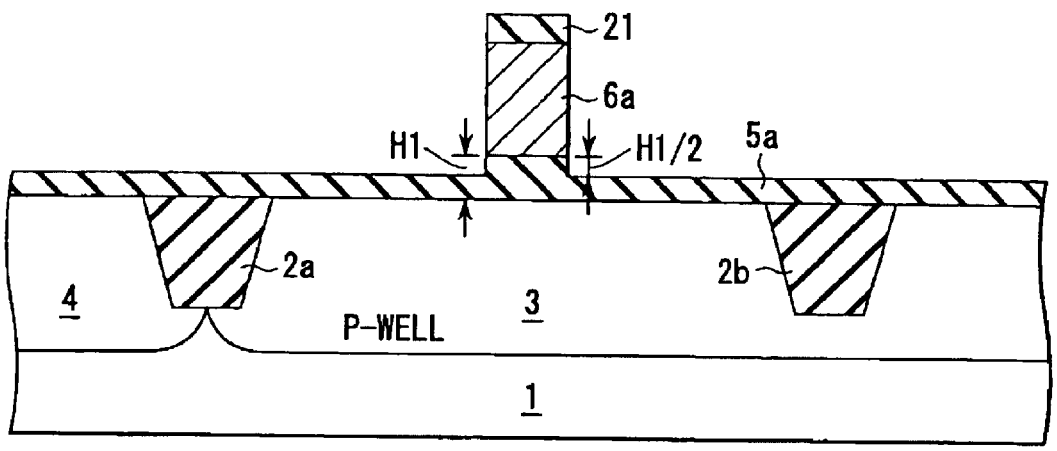
FIG. 5 is a sectional view of a gate section, explaining one of the steps of manufacturing a semiconductor device according to another embodiment of the present invention, in which a specific dielectric constant distribution is imparted to the gate insulating film.

As FIG. 5 shows, a gate insulating film, for example a Hf silicate film 5a, is formed to a prescribed thickness H1 on the P well 3 (and also on N well 4), both formed in a surface of a Si substrate 1. A polysilicon film is deposited on the Hf silicate film 5a. The polysilicon film will be processed to provide a gate electrode 6a.

Next, a SiN film is formed on the polysilicon film. The SiN film is patterned by means of photolithography, forming a hard mask 21. Using the hard mask 21, RIE is performed on the polysilicon film, patterning the polysilicon film and forming the gate electrode 6a.

During the RIE, the etching condition is altered after the gate electrode 6a is formed. All Hf silicate film 5a, but the part lying beneath the gate electrode 6a, is etched to about half (H·½) the initial thickness. As a result, as shown in FIG. 5, the sides of the Hf silicate film 5a lying beneath the gate electrode 6a are exposed at their upper halves, each having a height of about H½.

Thereafter, SiH$_4$ gas is introduced into the reaction furnace, along with diluting gas such as He. In the furnace, electrical discharging is effected, thus generating Si plasma. Silicon (Si) is thereby introduced into the Hf silicate film 5a.

Figure 6:
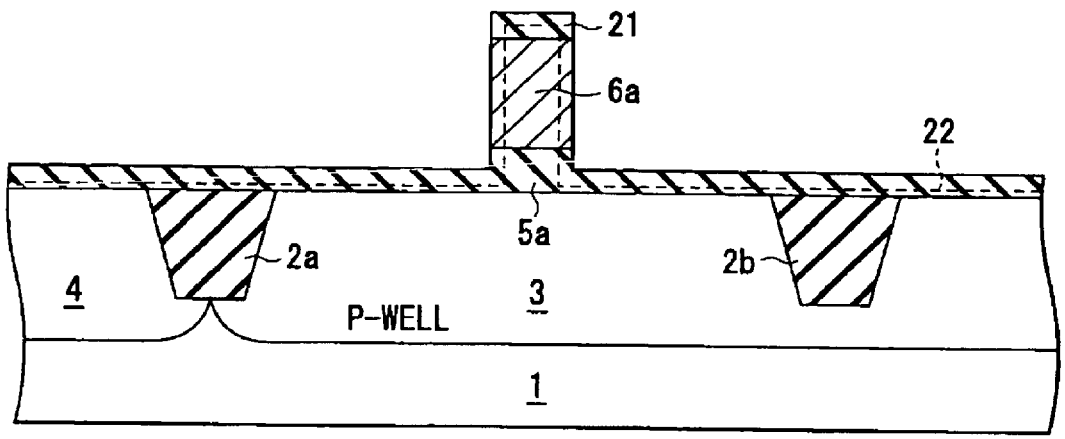
FIG. 6 is a sectional view showing the structure in which the gate section is included in the manufacturing step following the step of FIG. 5.

In the process, Si is introduced not only into the Hf silicate film 5a, but also into the gate electrode 6a made of polysilicon and the hard mask made of SiN as is illustrated in FIG. 6. Note that broken lines 22 in FIG. 6 indicate the parts of the Hf silicate film 5a, electrode 6a and hard mask, into which Si has been introduced. That part of the Hf silicate film 6a, which lies beneath the gate electrode 6a, is thicker than any other part. Therefore, Si is introduced into the sides of the part of the film 5a beneath the gate electrode 6a, but not into the center part thereof. It follows that the Si concentration is high in the sides of said part of the Hf silicate film 5a and is low in the center part thereof, in the channel length direction.

Figure 7:
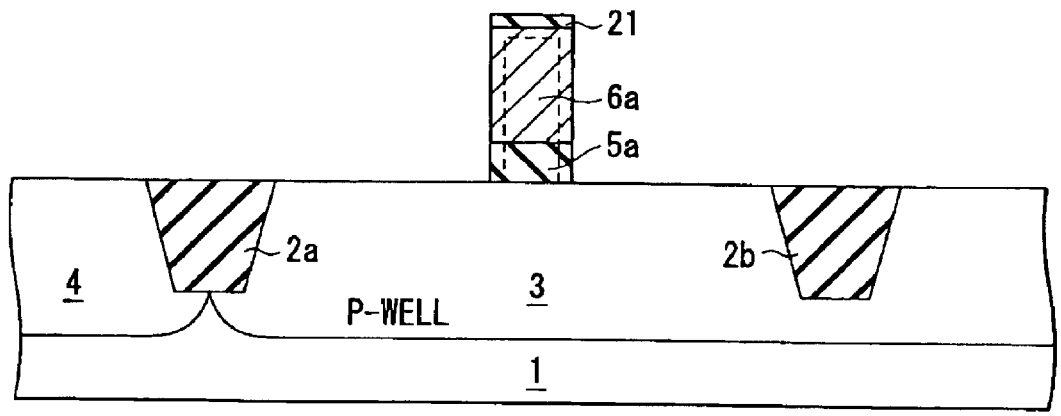
FIG. 7 is a sectional view showing the structure of the gate section in the manufacturing step following the step of FIG. 6.

Thereafter, the unnecessary part of the Hf silicate film 5a is removed by RIE, leaving the part beneath the gate electrode 6a, as is illustrated in FIG. 7.

Figure 8:
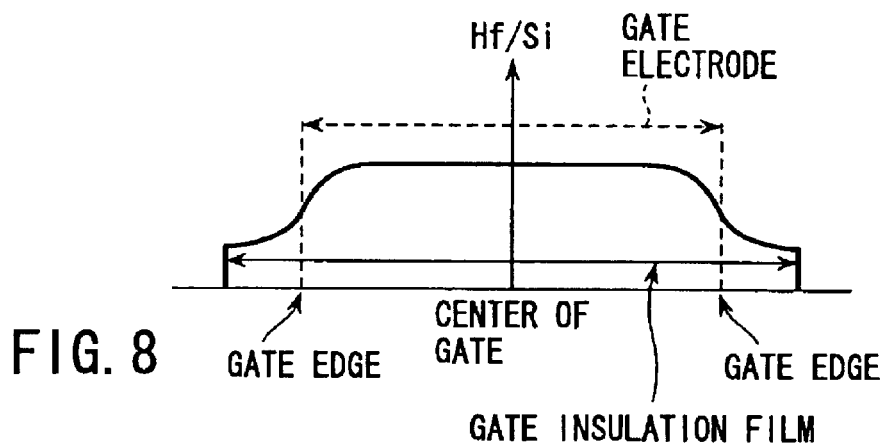
FIG. 8 is a diagram illustrating a specific dielectric constant distribution observed in the gate insulating film of a semiconductor device according to still another embodiment of the invention.

Thus, as can be understood from the Hf/Si ratio shown in FIG. 8, the Si concentration is high in the edges of the gate insulating film 5a (that is, Hf/Si ratio is small) and is low in the center wide part of the film 5a (that is, Hf/Si ratio is large). The gate insulating film 5a can therefore have a high dielectric constant in the center wide part and a low dielectric constant in the edges.

Figure 9:
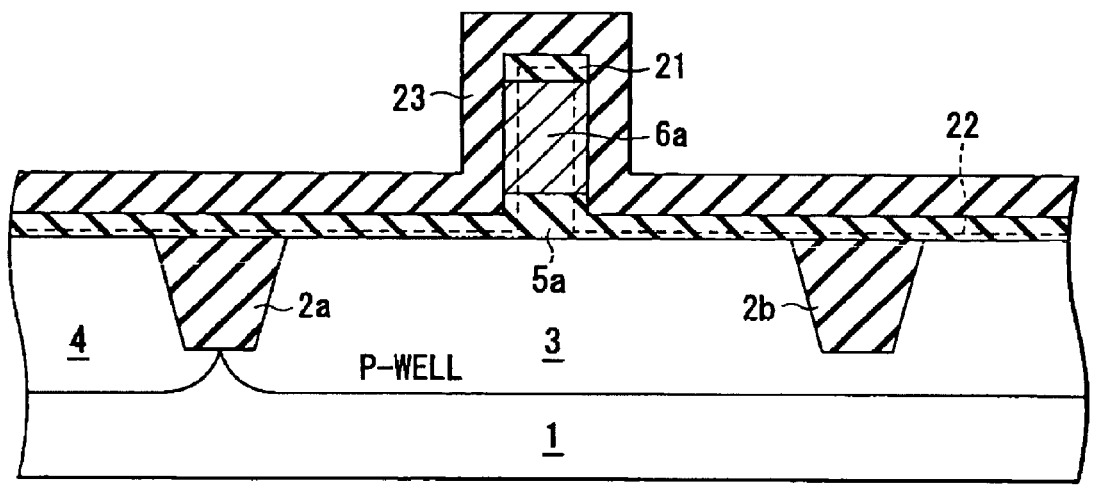
FIG. 9 is a sectional view showing the structure in which the gate section is included in one of the steps of manufacturing a MOSFET according to still further embodiment of the invention.
Figure 10:
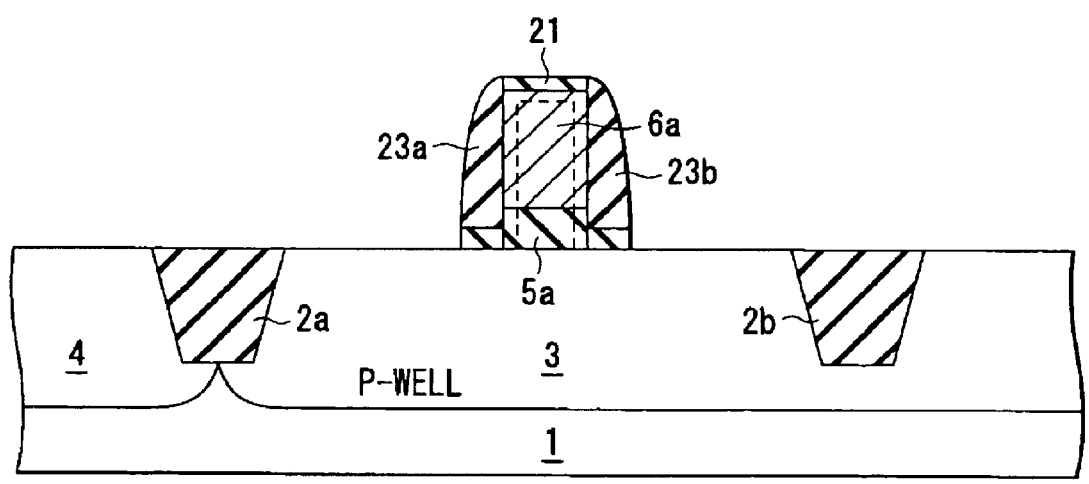
FIG. 10 a sectional view depicting the structure in which the gate section is included in the step following the step of FIG. 9.

Instead of removing the unnecessary part of the Hf silicate film 5a as explained with reference to FIG. 7, gate insulation film 23 is deposited on the whole surface of the substrate 1 as shown in FIG. 9 followed by an etching process to leave gate side-walls 23a and 23b on the sides of the gate electrode 6a as is shown in FIG. 10. In this case, the Hf silicate film 5a may be removed, but the parts that lie beneath the gate sidewalls 23a and 23b, may be left as is illustrated in FIG. 10.

Another method may be used to lower the dielectric constant of the edges of the gate insulating film 5a. In this method, Al plasma, not Si, is introduced into the edges of the gate insulating film in the step explained with reference to FIG. 6.

To introduce an element into the edges of the gate insulating film to lower the dielectric constant in the edges, the edges may be exposed to Si radical or Al radical at 400° C. or more, instead of being exposed to plasma.

In the MOSFET of FIG. 2, manufactured by the second embodiment described with reference to FIGS. 5 to 10, the lines of electric force become dense at the center part of the gate insulating film 5a and sparse at the edges of the film 5a in the channel length direction when the gate voltage is applied between the gate electrode 6a and the source/drain regions 7a and 7b. Hence, the electric field is distributed to be intense at the center part of the gate insulating film 5a. The electric field can therefore be prevented from concentrating at the edges of the gate electrode 6a.

In the semiconductor devices according to this invention, the concentration of an electric field at the gate edge of a MOSFET can be mitigated without rounding the gate electrode edge by oxidation, even if the gate insulating film is formed by materials which cannot make the gate edge rounded by the oxidation due to the limited thermal stability and resistance to oxidation of the gate insulating film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising a semiconductor substrate and a MOSFET provided on the semiconductor substrate, the MOSFET including a source region formed in the semiconductor substrate, a drain region formed in the semiconductor substrate, a channel region formed between the source region and the drain region in the semiconductor substrate, a gate insulating film and a gate electrode formed on the gate insulating film, said method comprising:

forming the gate insulating film having a first dielectric constant, on the semiconductor substrate; and forming a region in a side of the gate insulating film contacting the gate electrode to have a second dielectric constant lower than the first dielectric constant.

2. The method according to claim 1, wherein the forming of the gate insulating film includes forming a SiON film on the semiconductor substrate, and the forming of the region having the second dielectric constant includes introducing oxygen into the SiON film.

3. The method according to claim 2, wherein the forming of the gate insulating film includes forming a Hf silicate film identified as $(HfO_2)_x(SiO_2)_{1-x}$, on the semiconductor substrate, the forming of the region having the second dielectric constant includes introducing oxygen into the Hf silicate film, thereby setting a low $HfO_2$ ratio in that surface of the Hf silicate film which contacts the gate electrode and a high $HfO_2$ ratio in that surface of the Hf silicate film which contacts the semiconductor substrate.

4. The method according to claim 3, wherein the Hf silicate film is formed at about 400° C.

5. The method according to claim 3, wherein the Hf silicate film is formed by alternately supplying a Hf-based feed gas, a Si-based feed gas and oxygen gas into a film-forming atmosphere while increasing a supply rate of the oxygen gas with time.

* * * * *